United States Patent
Morrow

[11] Patent Number: 5,952,616
[45] Date of Patent: Sep. 14, 1999

[54] CABLE RETAINER WITH RETAINING SURFACES HAVING OFFSET PROTRUSIONS

[75] Inventor: Ernest Morrow, Tallahassee, Fla.

[73] Assignee: Hughes Electronics Corporation, El Segundo, Calif.

[21] Appl. No.: 08/918,375

[22] Filed: Aug. 26, 1997

Related U.S. Application Data

[63] Continuation of application No. 08/532,127, Sep. 22, 1995, abandoned.

[51] Int. Cl.$^6$ ................................................. H01B 17/00
[52] U.S. Cl. ........................ 174/135; 174/72 A; 174/155; 174/158 R; 174/168; 24/129 R
[58] Field of Search ........................... 174/138 G, 138 E, 174/138 R, 72 A, 135, 40 CC, 154, 155, 156, 158 R, 168, 174, 65 R; 24/129 R, 130; 361/807, 826, 827, 828

[56] References Cited

U.S. PATENT DOCUMENTS

| | | | |
|---|---|---|---|
| 483,771 | 10/1892 | Seymour | 174/166 R |
| 4,162,561 | 7/1979 | Tillemans | 24/129 R |
| 4,192,965 | 3/1980 | Baum | 174/135 |
| 4,224,465 | 9/1980 | Ruzic | 174/135 |
| 4,406,916 | 9/1983 | Southerland | 174/135 |
| 4,494,520 | 1/1985 | Hurwitz | 123/633 |
| 4,845,316 | 7/1989 | Kaercher | 174/135 |
| 5,189,766 | 3/1993 | Weber | 24/459 |
| 5,193,252 | 3/1993 | Svehaug | 24/115 G |
| 5,249,337 | 10/1993 | Cross et al. | 24/129 R |
| 5,307,243 | 4/1994 | Sharp et al. | 361/826 |
| 5,323,992 | 6/1994 | Sifers et al. | 248/205.3 |

FOREIGN PATENT DOCUMENTS

| | | | |
|---|---|---|---|
| 1246841 | 8/1967 | Germany | 174/135 |
| 1031013 | 7/1983 | U.S.S.R. | 174/135 |

*Primary Examiner*—Dean A. Reichard
*Assistant Examiner*—Kamand Cuneo
*Attorney, Agent, or Firm*—John T. Whelan; Michael W. Sales

[57] ABSTRACT

A cable retaining apparatus for retaining and routing lengths of cable on an assembly structure is provided. The cable retaining apparatus includes two or more adjacent retaining members extending from a surface of an assembly structure. The retaining members each have at least one retaining surface oriented such that each retaining surface faces the retaining surface of an adjacent retaining member forming a cable channel therebetween. The retaining members also include one or more protrusions extending from each of the oppositely facing retaining surfaces into the cable channel in a staggered or offset orientation. This configuration allows one or more cables to be routed within the cable channels and retained therein by the lateral retaining forces applied to the cable from the plurality of protrusions. The dimensions, spacing and location of the retaining members are adapted to accommodate selected cables such that the cable can be routed in any desired direction and retained in a fixed position on the assembly structure. Further, the dimensions and location of the protrusions extending from each retaining surface into the cable channel are such that the cable is preferably routed within the cable channel in a generally serpentine orientation thereby providing enhanced retaining action.

17 Claims, 3 Drawing Sheets

CABLE RETAINER WITH RETAINING SURFACES HAVING OFFSET PROTRUSIONS

This application is a Continuation of Application No. 08/532,127 filed on Sep. 22, 1995, now abandoned.

BACKGROUND OF THE INVENTION

This invention relates to cable retaining devices for routing and retaining cables and more particularly to cable retainers for constraining the movement of electronic cable along a selected routing path of an electronic assembly or module.

Conventional methods of retaining cables to an electronic assembly include bonded wire saddles, snap-in wire saddles, tie plates and cable ties. These cable retaining devices all suffer from one significant disadvantage, namely they involve small piece parts that can be difficult to properly install, especially where the electronic assembly is a relatively small assembly. Moreover, when disassembling the electronics assembly, some of the conventional cable retaining items can be somewhat difficult to remove without potentially damaging the retained cable. Further, the use of these cable retaining items translates into additional material and labor costs to the finished product and often require the use of special installation tools.

There are also several other related art cable retaining devices adapted for use with electronic assemblies including many unique configurations of cable retainers. For example, U.S. Pat. No. 4,406,916 issued to Southerland and U.S. Pat. No. 4,192,965 issued to Baum disclose several cable retainers specially adapted for retaining flat ribbon cables using specially designed guide structures which minimize stress on the cable members.

Another related art cable retainer is disclosed in U.S. Pat. No. 5,189,766 issued to Weber. The '766 patent discloses a snap fit cable retainer adapted for accommodating multiple diameter cables as well as several layers of cables. Large diameter cables are oriented in a first direction (i.e. lengthwise) through the retainer and smaller diameter cables are oriented in a crosswise orientation through the cable retainer. This related art cable retainer also accommodates a layer of cables in each direction simultaneously by placing the lower level in the crosswise direction through the retainer and the second layer on top in the lengthwise direction.

There are also numerous other cable retaining devices such as cable clamps, cable clips, cable guides and the like that are not practical for use with small electronic assemblies or modules and therefore, are not germane to the problems addressed by the present invention.

Thus, there is a continuing need for an improved cable retaining device adapted for use with electronic assemblies or modules that is simple in construction, relatively inexpensive and easy to use. In other words, cables must be easily retained and/or released from the cable retainer without much time and effort and without damage to the cable and cable retainer. Moreover, such cable retainers should preferably be fully integrated with the electronic assembly structure thus eliminating the problems associated with handling, installation, and replacement of small piece parts.

SUMMARY OF THE INVENTION

The present invention advantageously addresses the above and other needs by providing a cable retaining apparatus for retaining and routing lengths of cable on an assembly structure. The cable retaining apparatus includes a first retaining member disposed on an assembly structure and a second retaining member also attached to the assembly structure and spaced a small distance apart from the first retaining member forming a cable channel between oppositely facing surfaces of the two retaining members. The retaining members further include one or more protrusions extending from each oppositely facing surface into the cable channel in a staggered or offset orientation. The lengths of cable are routed through the cable channels and retained therein due to lateral retaining forces applied to the cable by the plurality of protrusions extending into the cable channel.

A desirable feature of the present cable retaining apparatus relates to the dimension and orientation of the aforementioned protrusion, extending from each retaining surface into the cable channel. In particular, the protrusions are dimensioned such that the cable is routed within the cable channel in a generally serpentine orientation thereby providing enhanced retaining action.

Another desirable feature of the present cable retaining apparatus is that it can be fully integrated with the assembly structure or housing. For example, the retainers can be cast or molded as part of the assembly structure at preselected locations. Advantageously, this would allow the cables of certain electronic assemblies to be assembled and disassembled with less effort and expense as compared to conventional cable retaining devices. Alternatively, the present cable retainers can be cast or molded individually and subsequently attached to the desired structure by bonding or other attachment means depending upon the application in which the cable retainer is used.

In accordance with another aspect of the invention, there is provided a cable retainer apparatus that provides a plurality of adjacent cable channels adapted to accommodate a plurality of cables. This embodiment of the cable retainer apparatus is adapted to receive and accommodate various size cables by forming the plurality of cable channels with different channel widths. This embodiment of the cable retaining apparatus includes a multiplicity of adjacent retaining members each having at least one retaining surface oriented such that each retaining surface faces the retaining surface of an adjacent retaining member forming cable channels therebetween. Also included are one or more offset or staggered protrusions extending from each retaining surface into the cable channel which retain the cables essentially as described above.

The present invention may also be characterized as an electronics assembly structure having one or more cable retaining projections extending from surfaces thereof. The cable retaining projections are disposed at preselected locations of the assembly structure for routing lengths of cable through the assembly structure in a preselected or desired direction. Each cable retaining projection includes a plurality of adjacent retaining members having at least one retaining surface oriented such that each retaining surface faces the retaining surface of the adjacent retaining member forming one or more cable channels between adjacent retaining members. Each retaining surface includes one or more protrusions extending into the cable channel that together with the oppositely facing protrusions on an adjacent retaining member retain the cable within the cable channel.

The dimensions, spacing, and location of the retaining members are adapted to accommodate selected cables such that the cable can be routed in any desired direction and retained in a fixed position on the assembly structure.

Further, the dimensions and location of the protrusions extending from each retaining surface into the cable channel are such that the cable is preferably routed within the cable channel in a generally serpentine orientation thereby providing enhanced retaining action.

Other features of the invention will be apparent from the following more detailed description of the preferred embodiments, taken in conjunction with the accompanying drawings, which illustrate, by way of example, the principles of the invention.

BRIEF DESCRIPTION OF THE DRAWINGS

In the following detailed description, reference will be made to the attached drawings in which.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 2:
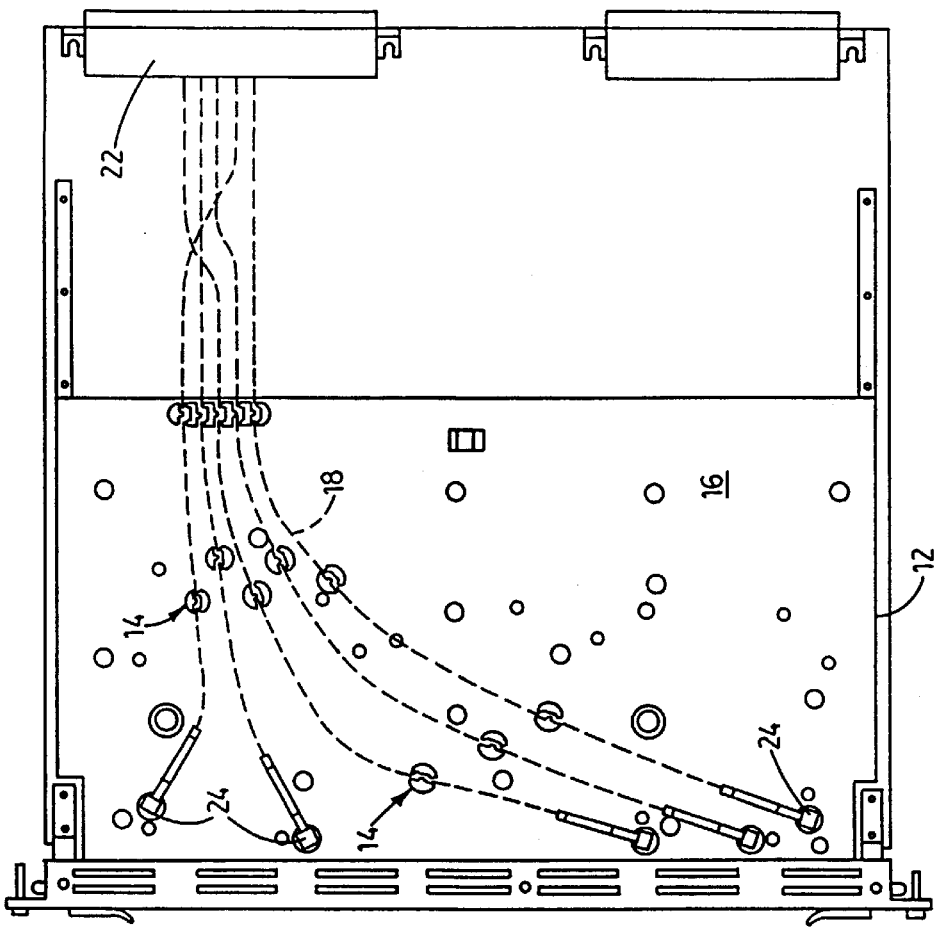
FIG. 2 is top view of the electronics assembly of FIG. 1 having lengths of cable routed in a preselected position and retained in such position with the cable retainers in accordance with the present invention.
Figure 1:
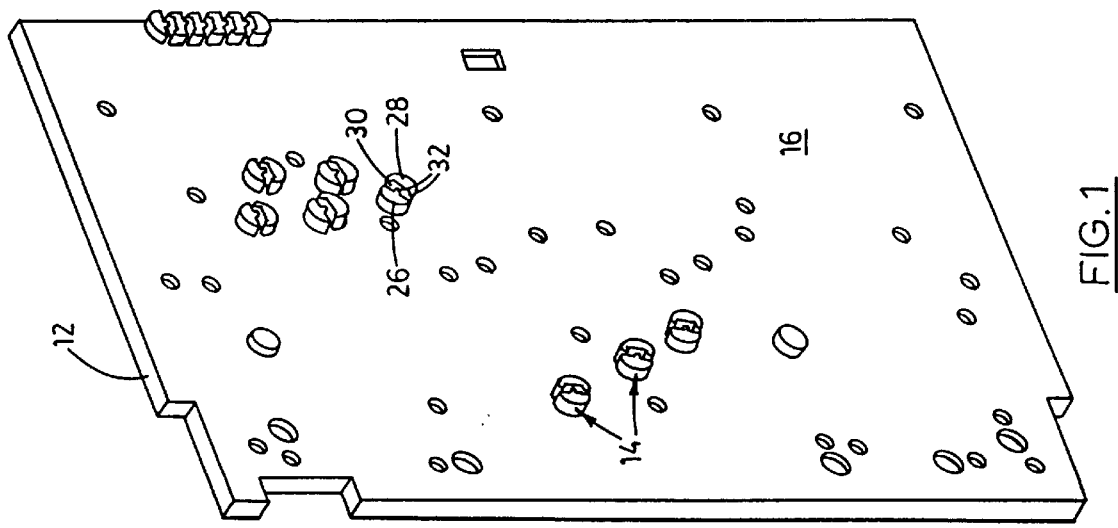
FIG. 1 is a perspective view of an electronics assembly with a plurality of cable retainers disposed thereon.

Referring now to the drawings, and particularly to FIGS. 1 and 2, there is shown two views of an electronics assembly base 12 with a plurality of cable retainers 14 disposed thereon. The cable retainers 14 are disposed on a surface 16 of the assembly 12 at preselected locations to facilitate the routing and retention of an electronic cable 18 in a desired position. As seen more clearly in FIG. 2, the cable retainers 14 are preferably placed so as to form a cable paths between a common cable connector 22 and several cable termination points 24 disposed throughout the assembly structure 12. While the illustrated embodiment of FIG. 2 is shown using insulated coaxial cable 18, it is contemplated that other electronic cables or fiber optic cables could be used with the present invention.

Each of the cable retainers 14 is comprised of a pair of adjacent retaining members 26, 28 extending from the surface 16 of the assembly 12 and oriented such that a cable channel 30 is formed in the space between the adjacent retaining members 26, 28. Each cable channel 30 is dimensioned to accommodate a particular diameter cable 18 such that the cable 18 can be routed through the electronics assembly base 12 along a predetermined path and securely retained in the desired position on the assembly 12. As discussed in more detail below, an appropriately sized cable 18 is preferably pressed into the cable channel 30 during the assembling process of the electronic module or assembly 12. The cable 18 is the retained within the cable channel 30 by lateral retaining forces applied by the staggered protrusions 32 extending from the adjacent retaining members 26, 28 into each cable channel 30.

In the presently disclosed embodiment, the cable retainers 14 are cast, molded or otherwise formed as part of the assembly 12 during the fabrication process of the assembly 12. By molding or casting the cable retainers 14 as part of the assembly 12, the time and expense typically associated with installing and securing electronic cable within an assembly 12 is minimized. In addition, molding or casting the cable retainers 14 as part of the assembly 12 fully integrates the cable retaining means with the assembly 12 and avoids problems associated with installing small piece parts.

The illustrated cable retainers 14 are preferably cast aluminum retainers structurally integrated (i.e. formed) as part of the assembly 12. Other materials commonly used for the construction of electronic assembly bases or assembly housings (i.e. plastics, fiberglass etc.) can be used in the construction of the cable retainers. Alternatively, the illustrated cable retainers 14 can be cast or molded individually and subsequently attached to the desired structure utilizing common bonding techniques or other suitable attachment means.

Figure 4:
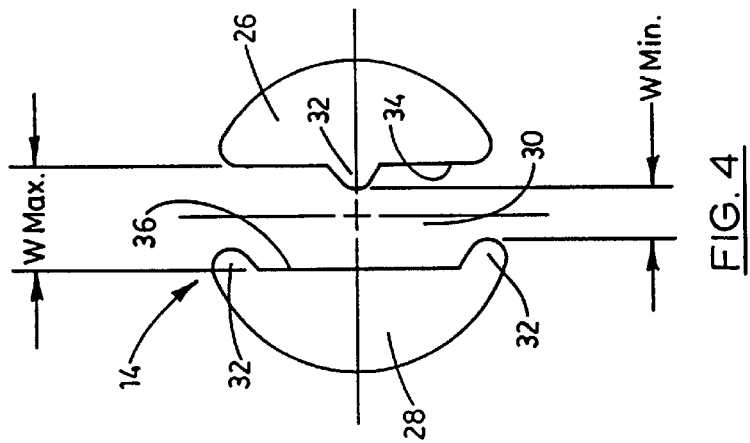
FIG. 4 is a top view of the embodiment of the cable retainer illustrated in FIG. 3.
Figure 5:
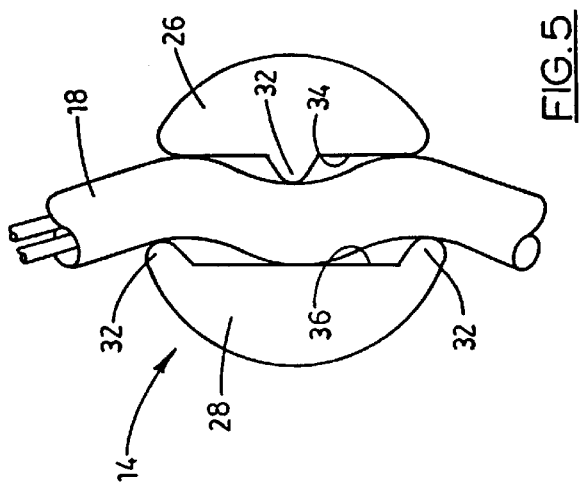
FIG. 5 is a top view of the embodiment of the cable retainer illustrated in FIG. 3 shown with a cable routed therein.
Figure 3:
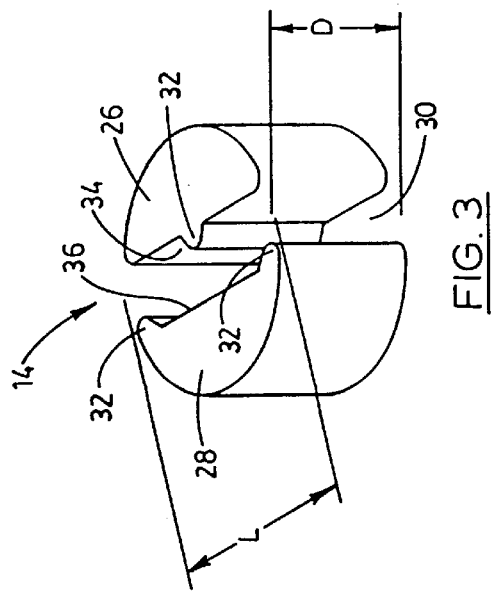
FIG. 3 is a perspective view of one embodiment of the cable retainer depicted in FIG. 1.

Turning now to FIGS. 3–5 there is shown a first embodiment of the cable retainer 14. As seen therein, the cable retainer 14 includes a first retaining member 26 and a second retaining member 28. The second retaining member 28 is spaced apart from the first retaining member 26 by a prescribed distance forming a slot or cable channel 30 between the two retaining members. The first and second retaining members 26, 28 each have an oppositely facing retaining surface 34, 36. On each retaining surface 34, 36 there are protrusions 32 extending therefrom into the cable channel 30. An important feature of the present cable retainer 14 is that the protrusions 32 extending from the first retaining surface 34 into the cable channel 30 are in a staggered orientation or offset from the protrusions 32 extending from the second retaining surface 36 into the cable channel 30.

As illustrated in FIGS. 1–5, the structural configuration of the cable retainer 14 is preferably a generally cylindrical projection extending from the surface 16 of the assembly 12 and having the slot or cable channel 30 passing traversley therethrough. The generally cylindrical projection is formed by placing the first and second retaining members 26, 28, each having a generally semi-circular cross-section, in oppositely facing adjacent positions. The multiple protrusions 32 extending from each retaining surface 34, 36 into the cable channel 30 preferably run along the entire depth, D, of the cable channel 30. The staggered positioning of the protrusions 32 extending into the cable channel 30 cause the cable 18 to be routed within the channel 30 in a serpentine like pattern or orientation.

With the above description of the cable retainer in mind, it may be helpful to provide some basic geometric definitions used in this application that relate to the operability and functionality of the present invention. For purposes of this application, the cable channel maximum width $W_{max}$ is the distance between the oppositely facing retaining surfaces of adjacent retaining members forming the cable channel. The cable channel minimum width $W_{min}$ the shortest lateral distance between two protrusions extending into the cable channel from oppositely facing retaining surfaces. The cable channel depth, D, is defined as the distance from the top of the retaining members to the bottom of the cable channel as measured in a direction perpendicular to the surface of the assembly on which the cable retainer is disposed. The cable channel length, L, is the distance along the cable channel in a direction parallel to the surface of the assembly on which the cable retainer is disposed, as measured along the retaining surfaces. Continuing with the definitions, the lengthwise axis is an axis formed in the direction of the cable channel length while the crosswise axis is an axis formed in the direction that passes through a central portion of the retaining members.

The dimensions of the cable retainer 14, and in particular, the dimensions of the cable channel 30 are specifically tailored for the application in which it is used. Specifically, the outer diameter of the insulated cable 18 (inclusive of the insulation) that is to be retained ultimately determines the dimensions of the cable retainer 14. For example, the maximum width, $W_{max}$, of cable channel 30 of the cable retainer 14 is preferably greater than or equal to the diameter of the cable 18 to be retained. Further, the minimum width, $W_{min}$, of the cable channel 30, as defined above, is slightly less than the diameter of the cable 18 to be retained. Finally, the depth, D, of the cable channel 30 is preferably selected to be approximately equal to or slightly greater than the insulated cable diameter.

As seen in FIG. 5, the insulated cable 18 to be retained is pressed into the cable channel 30 and is forced to conform to a serpentine orientation due to the staggered or offset position of the protrusions 32 extending into the cable channel 30. The insulated cable 18 is retained within the cable channel 30 due to the serpentine shape of the cable 18 coupled with lateral retaining forces applied to the insulated cable 18 by the protrusions 32. Preferably, the stiffness or rigidity of the insulated cable 18 is sufficiently large so that when appropriately engaged with the protrusions 32, the cable 18 and protrusions 32 generate retaining forces (i.e. friction forces) that effectively prevent the insulated cable 18 from slipping out of the cable retainer 14 when the assembly 12 is subjected to vibrations or shock forces realized under normal operating conditions. The insulated cable 18 can be removed from the cable retainer 14 without damage when a sufficiently large force oriented normal to the surface 16 of the assembly 12 lifts the cable 18 from the cable retainer 14.

The actual dimensions of the cable retainer 14 shown in FIGS. 3–5 facilitate its use in a small electronic assembly base 12 using small diameter cables 18. In particular, the illustrated cable retainer 14 is of aluminum construction and has a generally cylindrical shape with an outer diameter of approximately 0.40 inches. The cable channel 30 has a maximum width, $W_{max}$, of approximately 0.14 inches and a minimum width, $W_{min}$, of approximately of 0.08 inches. The cable channel depth, D, is about 0.20 inches and the cable channel length, L, is approximately 0.40 inches. The illustrated embodiment of the cable retainer 14 includes three semi-cylindrical protrusions 32, each of which is about 0.06 inches in diameter (width) and extend approximately 0.03 inches into the cable channel 30.

Figure 7:
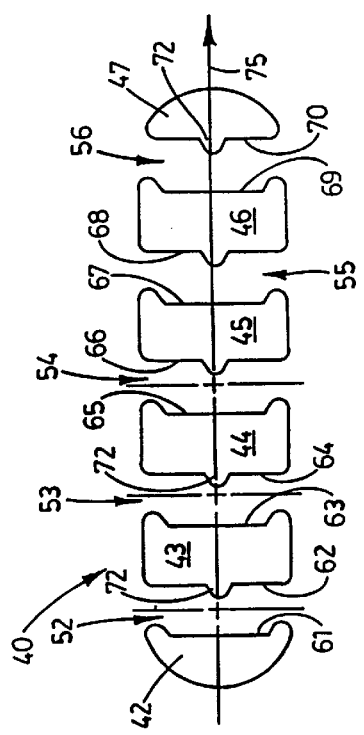
FIG. 7 is a top view of the embodiment of the cable retainer illustrated in FIG. 6.
Figure 6:
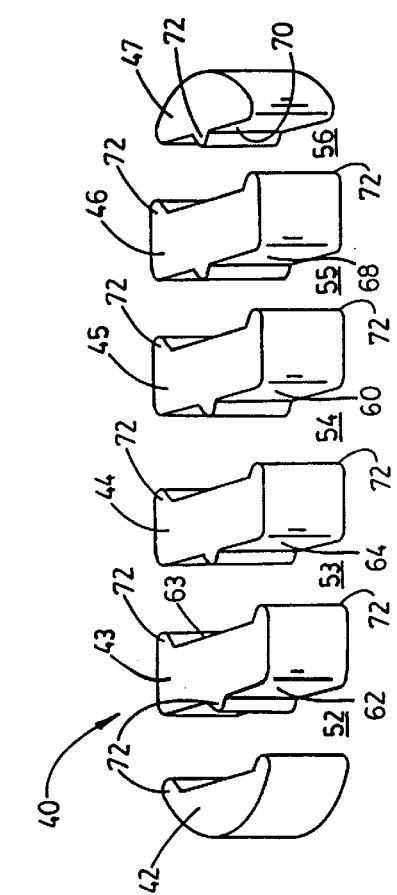
FIG. 6 is a perspective view of another embodiment of the cable retainer depicting a plurality of cable retaining members and cable channels.

Referring now to FIGS. 6 and 7, another embodiment of the cable retainer 40 is shown. This embodiment includes a plurality of retaining members, 42 through 47, placed in adjacent positions forming a series of cable channels 52 through 56 between adjacent retaining members. In the illustrated embodiment, there are six retaining members including two outer retaining members 42,47 and four interior members 43,44,45,46 which form five cable channels, 52,53,54,55,56. The outer retaining members 42,47 each have one retaining surface 61,70 which faces an adjacent retaining member. The four interior retaining members 43,44,45,46 have two oppositely disposed retaining surfaces, identified with the numerals 62,63,64,65,66,67,68, 69, and each of which faces an adjacent retaining member. The retaining members, 42 through 47, are positioned relative to one another such that the lengthwise axes 75 of each cable channel, 52 through 56, are formed are in a generally parallel orientation.

As with the earlier described embodiment, each retaining member, 42 through 47, has one or more protrusions 72 extending from each retaining surface into the associated cable channel. The protrusions 72 extending into each cable channel are situated in a generally staggered or offset orientation relative to one another. In addition, each retaining member, 42 through 47 in the illustrated cable retainer 40 are constructed such that any two oppositely facing retaining surfaces (e.g. 61/62, 63/64, etc.) are generally parallel surfaces preferably oriented normal to the surface of the assembly to which they are attached.

As an illustrative example of the configuration of the cable retainer, consider retaining member 44 as shown in FIGS. 6 and 7. Retaining member 44 has two oppositely disposed retaining surfaces, 64 and 65. Retaining surface 64 faces a generally parallel retaining surface 63 of adjacent retaining member 43 while retaining surface 65 faces a generally parallel retaining surface 66 of adjacent retaining member 45 forming two parallel cable channels 53 and 54.

Another feature of the cable retainer 40, as illustrated in FIGS. 6 and 7, is that all cable channels, 52 through 56, have uniform widths ($W_{max}$ and $W_{min}$). This embodiment of the cable retainer 40 is particularly useful where it is necessary to route several identically size cables along a similar path. As with the first embodiment, an appropriately sized cable is retained within the cable channel due in part to the lateral retaining forces between the cable and the protrusions coupled with the generally serpentine orientation of the retained cable. The appropriately sized cable preferably includes an insulated cables whose diameter is less than the maximum width of cable channel and whose diameter is slightly greater than the minimum width of the cable channel.

Figure 9:
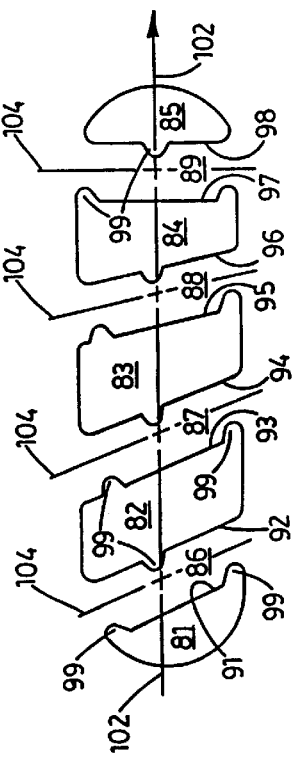
FIG. 9 is a top view of the embodiment of the cable retainer illustrated in FIG. 8.
Figure 8:
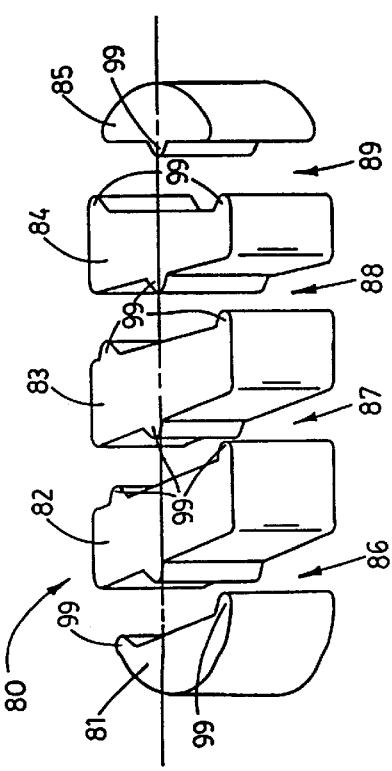
FIG. 8 is a perspective view of still another embodiment of the cable retainer depicting a plurality of cable retaining members and cable channels wherein the lengthwise axes of the cable channels are oriented at an angle relative to the cable retaining members.

FIGS. 8 and 9 shows various views of still another embodiment of the cable retainer 80 which also comprises a plurality of retaining members, 81 through 85, placed in adjacent positions forming a series of cable channels, 86 through 89, between adjacent retaining members. In this third embodiment, there are five retaining members 81,82, 83,84,85 including two outer retaining members 81,85 and three interior members 82,83,84 which yield four cable channels 86,87,88,89. Again, the outer retaining members 81,85 each have one retaining surface 91,98 respectively, with one or more protrusions 99 extending into the cable channels 86,89 and facing an adjacent retaining member. The interior retaining members 82,83,84 have two oppositely disposed retaining surfaces 92,93,94,95,96,97, each of which faces an adjacent retaining member and includes several protrusions 99 extending into the respective cable channel 86,87,88,89. For example, retaining member 82 has two oppositely disposed retaining surfaces 92,93. Retaining surface 92 faces a generally parallel retaining surface 91 of adjacent retaining member 81 while retaining surface 93 faces a generally parallel retaining surface 94 of adjacent retaining member 83. Both retaining surfaces 92,93, have protrusions 99 extending into cable channels 86,87 respectively.

A distinguishing feature of this third embodiment is that the lengthwise axes 102 of the cable channels, 86 through 89, are not necessarily parallel to one another and more importantly are oriented at an angle relative to the crosswise axis 104. In the illustrated embodiment, the lengthwise axes 102 of the cable channels, 86 through 89, are oriented at an angle of either 90°, 75°, or 65° in a particular direction from the crosswise axis 104.

Another feature shown in this third embodiment is that the cable channel widths, $W_{max}$ and $W_{min}$ are not uniform for all the cable channels. Rather, the cable channel widths vary for each of the four cable channels 86,87,88,89. This feature is particularly useful where the multiple size cables are used in the electronics assembly base. As with the earlier described embodiments, an appropriately sized cable is retained within each cable channel due in part to the lateral retaining forces between the cable and the protrusions coupled with the generally serpentine orientation of the retained cable within the cable channel.

The present invention and its advantages will be understood from the foregoing description, and it will be apparent that numerous modifications and variations could be made thereto without departing from the spirit and scope of the invention or sacrificing all of its material advantages, the forms hereinbefore described being merely exemplary embodiments thereof. To that end, it is not intended that the scope of the invention be limited to the specific embodiments illustrated and described. Rather, it is intended that the scope of this invention be determined by the appending claims and their equivalents.

What is claimed is:

1. A cable retainer apparatus for accommodating and routing lengths of cable wherein the lengths of cable can be routed in any desired direction and retained in a fixed position, the cable retainer apparatus comprising:

a first retaining member disposed on an assembly structure, said first retaining member having a first flat retaining surface, the first retaining member being dimensioned such that said first flat retaining surface directly contacts and retains a length of cable;

a second retaining member attached to said assembly structure and spaced apart from said first retaining member forming a cable channel therebetween, said second retaining member having a second flat retaining surface facing said first flat retaining surface, said second retaining member being dimensioned such that said second flat retaining surface directly contacts and retains the length of cable, said cable channel being adapted for routing the length of cable therein; and one or more protrusions extending from each flat retaining surface into said cable channel, said protrusions extending from said first flat retaining surface into said cable channel being offset from said protrusions extending from said second flat retaining surface into said cable channel, said protrusions being adapted for applying lateral retaining forces to the length of cable.

2. The cable retaining apparatus of claim 1 wherein said first and second retaining members are attached to said assembly structure at preselected locations to facilitate routing said lengths of cable through said assembly structure in the desired direction.

3. The cable retaining apparatus of claim 1 wherein said first and second retaining members are formed as part of said assembly structure and extend from a surface thereof at preselected locations to facilitate routing said lengths of cable through said assembly structure in the desired direction.

4. The cable retaining apparatus of claim 1 wherein said retaining members and said protrusions extending from each flat retaining surface into said cable channel are dimensioned to accommodate and retain lengths of electronic cable.

5. The cable retaining apparatus of claim 1 wherein said retaining members and said protrusions extending from each flat retaining surface into said cable channel are dimensioned to accommodate and retain lengths of fiber optic cable.

6. The cable retaining apparatus of claim 1 wherein said protrusions extending from each flat retaining surface into said cable channel are dimensioned such that said lengths of cable are routed within said cable channels in a generally serpentine orientation.

7. The cable retaining apparatus of claim 1, wherein said first and second retaining members collectively form a cylindrical projection with said cable channel passing traversely therethrough.

8. A cable retainer apparatus for accommodating and routing lengths of cable on an assembly structure wherein said lengths of cable can be routed in any desired direction and retained in a fixed position, the cable retainer apparatus comprising:

a plurality of retaining members each having at least one flat retaining surface, each of said retaining members being disposed in adjacent positions and oriented such that said at least one flat retaining surface of one of said retaining members oppositely faces a said at least one flat retaining surface of an adjacent one of said retaining members forming a cable channel therebetween, said at least one retaining member being dimensioned such that said at least one flat retaining surface directly contacts and retains said lengths of cable, said cable channel being adapted for routing one of said cable lengths therein; and one or more protrusions extending from each at least one flat retaining surface into said cable channel, said protrusions extending from each at least one flat retaining surface into said cable channels being offset from said protrusions extending from said oppositely facing at least one flat retaining surface into said cable channels, said protrusions being adapted for applying lateral retaining forces to said length of cable.

9. The cable retaining apparatus of claim 8 wherein a spacing between oppositely facing flat retaining surfaces is a preselected uniform channel width to accommodate multiple lengths of cable having a preselected cable diameter.

10. The cable retaining apparatus of claim 8 wherein a spacing between oppositely facing flat retaining surfaces is a non-uniform channel width such that said cable retaining apparatus provides different cable channel widths to accommodate various cable diameters.

11. The cable retaining apparatus of claim 8 wherein said plurality of retaining members are aluminum retaining members attached to said assembly structure at preselected locations to facilitate routing said lengths of cable through said assembly structure in a desired direction.

12. The cable retaining apparatus of claim 8 wherein said plurality of retaining members are formed as part of said assembly structure and extend from a surface thereof at preselected locations to facilitate routing said lengths of cable through said assembly structure in a desired direction.

13. The cable retaining apparatus of claim 8 wherein said plurality of retaining members and said protrusions extending from each at least one flat retaining surface into said cable channel are dimensioned to accommodate and retain lengths of electronic cable.

14. The cable retaining apparatus of claim 8 wherein said plurality of retaining members and said protrusions extending from each said at least one flat retaining surface into said cable channel are dimensioned to accommodate and retain lengths of fiber optic cable.

15. The cable retaining apparatus of claim 8 wherein said protrusions extending from each said at least one flat retaining surface into said cable channel are dimensioned such that said one of said lengths of cable are routed within said cable channel in a generally serpentine orientation.

16. A cable retainer apparatus for accommodating and routing lengths of cable wherein the lengths of cable can be routed in any desired direction and retained in a fixed position, the cable retainer apparatus comprising:

a first end retaining member attached to an assembly structure, said first end retaining member having a first flat end retaining surface, the first end retaining member being dimensioned such that said first flat end retaining surface directly contacts and retains one of the lengths of cable;

a second end retaining member attached to said assembly structure, said second end retaining member having a second end flat retaining surface, wherein the first end flat retaining surface generally faces and is not parallel with the second end flat retaining surface, the second end retaining member being dimensioned such that said second flat end retaining surface directly contacts and retains another of the lengths of cable;

a plurality of retaining members attached to said assembly structure and disposed between the first and second end retaining members to form a plurality of cable channels, each of the plurality of retaining members having oppositely facing first and second flat retaining surfaces that generally face toward the first and second end flat retaining surfaces, respectively, such that each of the plurality of cable channels has parallel flat retaining surfaces, said first and second flat retaining surfaces for contacting and retaining ones of the lengths of cable, said each of said plurality of cable channels for routing said lengths of cable therein; and one or more protrusions extending from each of said first and second end flat retaining surfaces into said cable channels, one(s) of said protrusions extending respectively from one of said first and second end flat retaining surfaces being offset from another (others) of said protrusions extending from another of said first and second end flat retaining surfaces.

17. A cable retaining apparatus as defined in claim 16, wherein:

the plurality of retaining members comprise first and second retaining members forming first, second and third cable channels; and the first cable channel has a crosswise axis in the direction of the channel that is substantially perpendicular to a lengthwise axis passing generally through a central point of each retaining surface, the second cable channel has a crosswise axis that is at an angle that is about 75 degrees with respect to the lengthwise axis, and the third cable channel has a crosswise axis that is at an angle that is about 65 degrees with respect to the lengthwise angle so that said lengths of cable retained in the cable channels are directed in different directions.

* * * * *